(12) United States Patent
Hsue et al.

(10) Patent No.: US 6,696,222 B2
(45) Date of Patent: Feb. 24, 2004

(54) DUAL DAMASCENE PROCESS USING METAL HARD MASK

(75) Inventors: Chen-Chiu Hsue, Hsinchu (TW); Shyh-Dar Lee, Hsinchu Hsien (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 188 days.

(21) Appl. No.: 09/910,876

(22) Filed: Jul. 24, 2001

(65) Prior Publication Data

US 2003/0044725 A1 Mar. 6, 2003

(51) Int. Cl.$^7$ .............. G03F 7/36; C23F 1/00; H01L 21/027
(52) U.S. Cl. ............ 430/313; 430/311; 430/312; 430/314; 430/316; 430/317; 430/318; 216/41; 216/51; 438/622; 438/634; 438/637; 438/638; 438/734; 438/737; 438/740; 438/742
(58) Field of Search .................. 430/311, 312, 430/313, 314, 316, 317, 318; 216/41, 51; 438/622, 634, 637, 638, 734, 737, 740, 742

(56) References Cited

U.S. PATENT DOCUMENTS

| | | | | | |
|---|---|---|---|---|---|
| 5,635,423 A | * | 6/1997 | Huang et al. | ............... | 438/638 |
| 6,054,384 A | * | 4/2000 | Wang et al. | ................ | 438/637 |
| 6,071,809 A | * | 6/2000 | Zhao | ........................... | 438/634 |
| 6,103,616 A | * | 8/2000 | Yu et al. | ..................... | 438/622 |
| 6,114,250 A | * | 9/2000 | Ellingboe et al. | ........... | 438/709 |
| 6,159,661 A | | 12/2000 | Huang et al. | ............... | 430/313 |
| 6,350,700 B1 | * | 2/2002 | Schinnella et al. | ......... | 438/723 |
| 6,368,979 B1 | * | 4/2002 | Wang et al. | ................ | 438/723 |
| 6,372,653 B1 | * | 4/2002 | Lou et al. | ................... | 438/706 |
| 6,486,059 B2 | * | 11/2002 | Lee et al. | ................... | 438/637 |
| 2003/0008490 A1 | * | 1/2003 | Xing et al. | ................. | 438/622 |
| 2003/0044725 A1 | * | 3/2003 | Hsue et al. | ................. | 430/314 |

* cited by examiner

Primary Examiner—Mark F. Huff
Assistant Examiner—Nicole Barreca
(74) Attorney, Agent, or Firm—Birch, Stewart, Kolasch & Birch, LLP

(57) ABSTRACT

A dual damascene process is provided on a semiconductor substrate, having a conductive structure and a low-k dielectric layer covering the conductive structure. A first hard mask and a second hard mask are sequentially formed on the low-k dielectric layer, in which at least the hard mask contacting the low-k dielectric layer is of metallic material. Next, a first opening is formed in the second hard mask over the conductive structure, and a second opening is then formed in the first hard mask under the first opening. Afterward, the low-k dielectric layer that is not covered by the first hard mask is removed, thus a via hole is formed. Thereafter, the first hard mask that is not covered by the second hard mask is removed, and then the exposed low-k dielectric layer is removed. Thereby, a trench is formed over the via hole.

14 Claims, 17 Drawing Sheets

DUAL DAMASCENE PROCESS USING METAL HARD MASK

BACKGROUND OF THE INVENTION

1. Field of the Invention

The present invention relates to a dual damascene process and, more particularly, to a dual damascene process using at least one metal hard mask.

2. Description of the Related Art

High-density integrated circuits, such as very large scale integration (VLSI) circuits, are typically formed with multiple metal interconnects to serve as three-dimensional wiring line structures. The purpose of multiple interconnects is to properly link the densely packed devices together. With increasing levels of integration, a parasitic capacitance effect between the metal interconnects, which leads to RC delay and cross talk, increases correspondingly. Therefore, in order to reduce the parasitic capacitance for increasing the speed of conduction between the metal interconnections, a type of low-k organic dielectric material is commonly employed to form an inter-layer dielectric (ILD) layer. However, there are technical problems regarding the use of low-k organic dielectric materials for the ILD layers.

FIGS. 1A to 1C depict cross-sectional diagrams of the formation of a via hole between metal interconnects using conventional technique. As shown in FIG. 1A, a semiconductor substrate 10 has a metal wire structure 12, a low-k dielectric layer 14 formed over the exposed substrate 10 and the metal wire structure 12, an oxide hard mask 16 deposited over the low-k dielectric layer 14, and a photoresist layer 18 patterned on the oxide hard mask 16. Using the photoresist layer 18 as a mask, the oxide hard mask 16 is etched to form an opening above the metal wire structure 12. Then, as shown in FIG. 1B. etching is continued to form a via hole 19 in the low-k dielectric layer 14. The via hole 19 with steep sidewalls 15 exposes the metal wire structure 12. Finally, the photoresist layer 18 is removed by oxygen plasma process. However, the low-k dielectric layer 14 of carbon-containing organic polymer has properties very similar to the photoresist layer 18, and the low-k dielectric layer 14, has very low resistance against oxygen plasma etching. Therefore, as shown in FIG. 1C, a portion of the exposed sidewalls 15 will be removed during the oxygen plasma process, resulting in recess cavities 15a forming on the sidewalls 15. Also, if a BARC is used under the photoresist layer 18, the etch profile of the via hole 19 will be more difficult to control. In addition, since the oxygen plasma easily poisons low-k organic materials, only $SiO_2$ based materials such as FSG, USG, BLACK DIAMON, CORAL, AURORA, and FLOW-FILL are suitable for making the low-k dielectric layer 14. Thus, the use of low-k organic materials is limited in conventional technique.

Seeking to solve the aforementioned problems, U.S. Pat. No. 6,159,661 discloses a damascene process including the formation of an additional cap layer, preferably of silicon oxynitride (SiON), over the oxide hard mask. The cap layer is able to protect the low-k dielectric layer from oxygen plasma process when stripping the photoresist layer. However, when patterning the cap layer, the problem of tuning a high etching-selectivity between the cap layer and the oxide hard mask is encountered. Further, only low-k organic materials can be applied to the formation of the ILD layers.

Thus, a dual damascene process using dual hard masks, in which at least the hard mask contacting the low-k dielectric layer is of metallic materials, is desired to solve the aforementioned problems

SUMMARY OF THE INVENTION

The present invention is a dual damascene process with dual hard masks, in which at least the hard mask contact the low-k dielectric layer is of metallic materials.

The dual damascene process is provided on a semiconductor substrate, which has a conductive structure, a dielectric separation layer covering the conductive structure, and a low-k dielectric layer over the dielectric separation layer. The conductive structure is preferably copper. The low-k dielectric layer may be of organic polymer formed by a spin-on coating process, and alternatively may be $SiO_2$-based materials formed by chemical vapor deposition (CVD). In another preferred embodiment, a patterned etch stop layer is additionally provided in the low-k dielectric layer serving as a hard mask in the subsequent process of forming a via hole and serving as an etching endpoint in the subsequent process of forming a trench.

A first hard mask of metallic material is formed on the low-k dielectric layer, and then a second hard mask is formed on the first hard mask. The second hard mask may be metallic or dielectric material. Next, using photolithography and etching, a first opening is formed in the second hard mask over the conductive structure, and then a second opening is formed in the first hard mask under the first opening. The diameter of the first opening is larger then the second opening. Afterward, the low-k dielectric layer that is not covered by the first hard mask is removed until the dielectric separation layer is exposed, thereby forming a via hole in the low-k dielectric layer. Thereafter, the first hard mask that is not covered by the second hard mask is removed, and the exposed low-k dielectric layer is then removed to reach a predetermined depth. As a result, a trench is formed over the via hole, and the trench and the via hole serve as a dual damascene opening.

Accordingly, it is a principle object of the invention to provide dual metal hard masks for preventing oxygen plasma from making contact the low-k dielectric layer when a photoresist layer is removed.

It is another object of the invention to increase the gap-filling capacity of the subsequently deposited conductive layer in the dual damascene opening.

Yet another object of the invention is to provide low-k organic materials in the formation of the low-k dielectric layer.

It is a further object of the invention to reduce RC delay and cross talk, therefore allowing chip size to be scaled down to the next generation.

Still another object of the invention is to provide the dual hard masks as an anti-reflection coating (ARC) in subsequent deep ultra violet (DUV) photolithographic operations.

Another object of the invention is to lower the production cost and simplify the dual damascene process.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

First Embodiment

A dual damascene process using dual hard masks is provided. Preferably, the dual hard masks are both of metallic material. Alternatively, one of the dual hard masks, positioned on the low-k dielectric layer, is of metallic material.

Figure 1A:
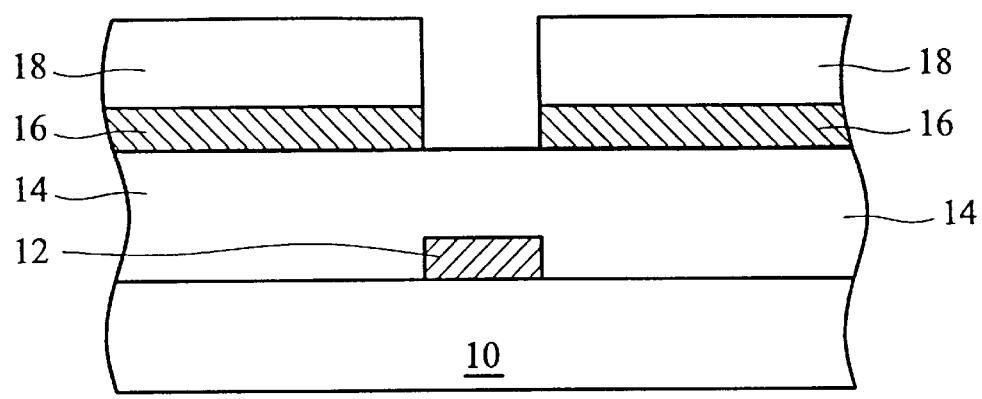
FIGS. 1A to 1C are cross-sectional diagrams showing a conventional technique of forming a via hole between metal interconnects.
Figure 1B:
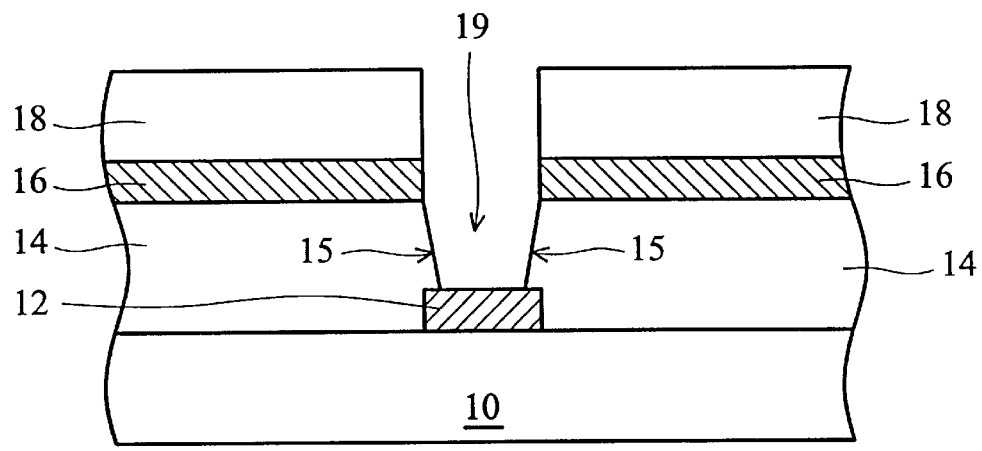
Figure 1C:
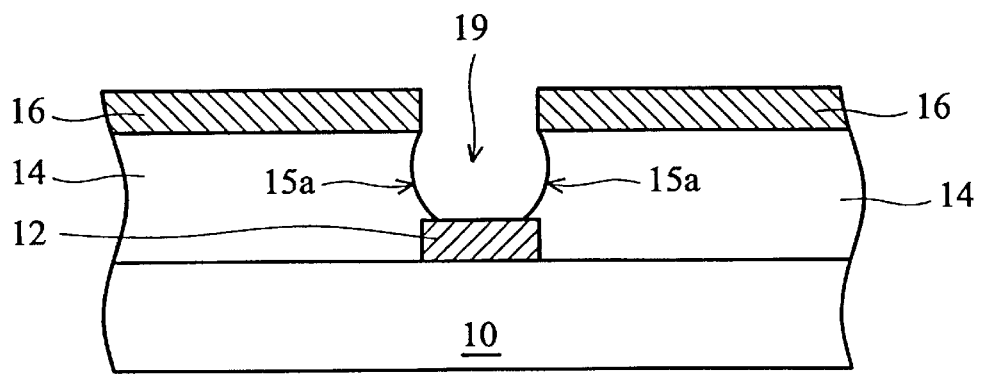
Figure 2A:
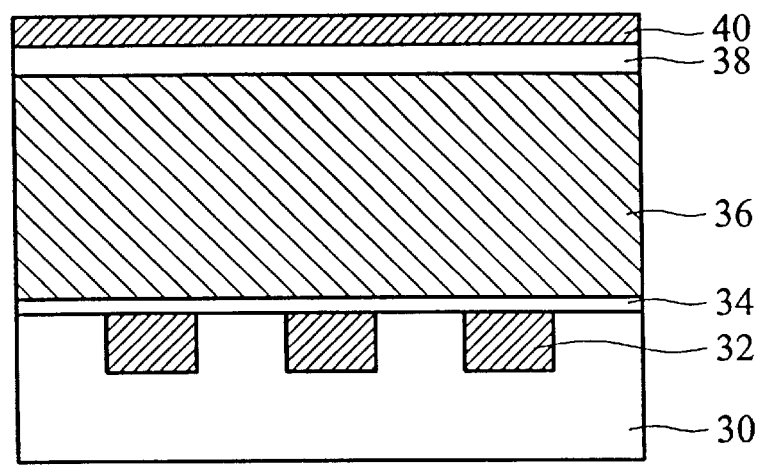
FIGS. 2A to 2L are cross-sectional diagrams showing a dual damascene process in the first embodiment of the present invention.

FIGS. 2A to 2L are cross-sectional diagrams showing a dual damascene process in the first embodiment of the present invention. As shown in FIG. 2A, a semiconductor substrate 30 comprises a plurality of metal wire structures 32, a dielectric separation layer 34 covering the metal wire structures 32 and the exposed substrate 30, and a low-k dielectric layer 36 formed on the dielectric separation layer 34. The dielectric separation layer 34 prevents the metal wire structures 32 from oxidizing and prevents the atoms/ions in the metal wire structures 32 from diffusing into the low-k dielectric layer 36. Preferably, the metal wire structure 32 is copper, and the dielectric separation layer 34 is silicon nitride or silicon carbide. The low-k dielectric layer 36 is of organic materials, such as spin-on polymer (SOP), FLARE, SILK, PARYLENE and/or PAE-II, and formed through a spin-coating process. Alternatively, the low-k dielectric layer 36 is of $SiO_2$-based materials, such as $SiO_2$, FSG or USC, and formed through a spin-coating process, or BLACK DIAMON, CORAL, AURORA, and FLOWFILL, and formed through a chemical vapor deposition (CVD) Process.

In addition, a first hard mask 38 and a second hard mask 40 are sequentially formed on the low-k dielectric layer 36. Preferably, the first hard mask 38 is of metallic material, such as Ti, TiN, Ta, TaN, Al, or AlCu. The second hard mask 40 is preferably of metallic materials, such as Ti, TiN, Ta, TaN, Al, or AlCu, and alternatively of dielectric materials, such as $SiO_2$, SiC, SiN, SRO or SiON.

Figure 2B:
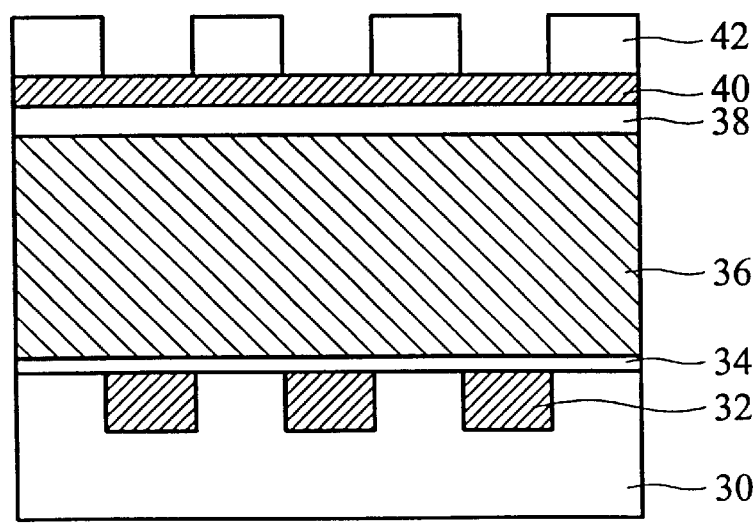
Figure 2C:
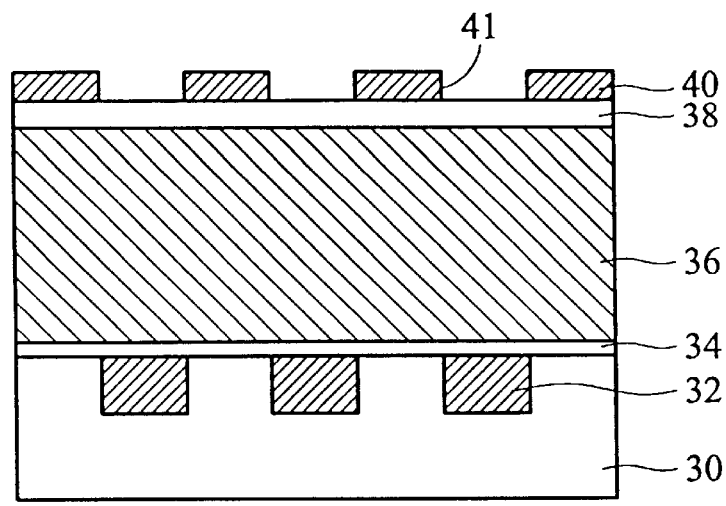
Figure 2D:
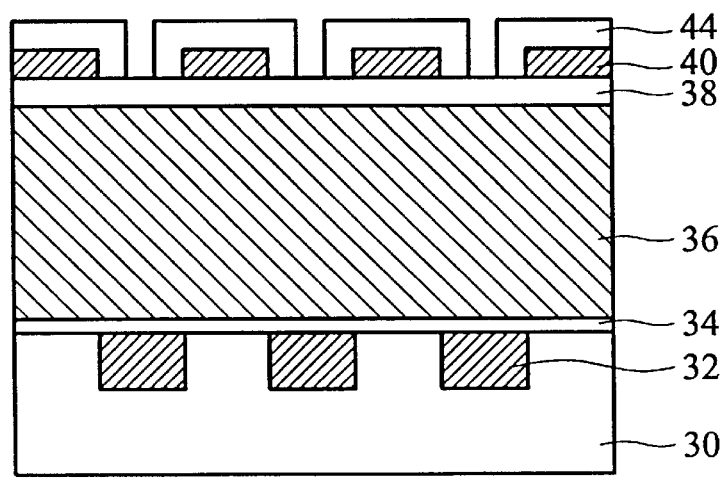
Figure 2E:
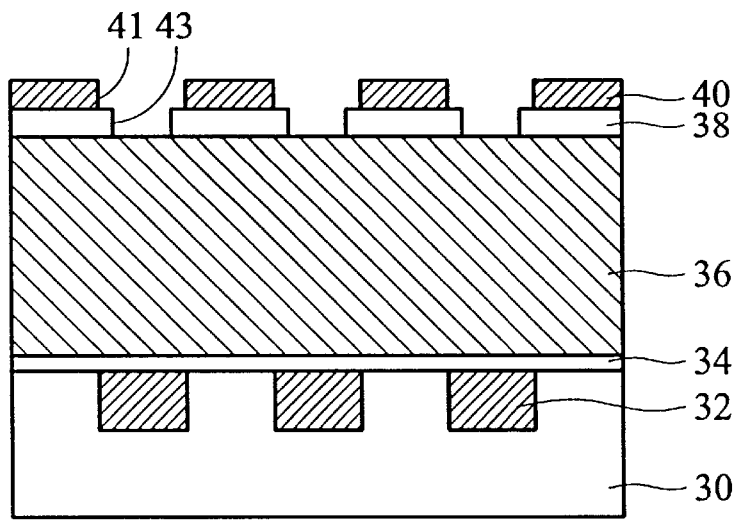

As shown in FIGS. 2B and 2C, a first photoresist layer 42 is patterned on the second hard mask 40 to define a trench of a dual damascene opening, and then a plurality of first openings 41 are formed in the second hard mask 40 with the first photoresist layer 42 as a mask. Next, the first photoresist layer 42 is removed. As shown in FIGS. 2D and 2E, a second photoresist layer 44 is patterned on the second hard mask 40 and the first hard mask 38 to define a via hole of a dual damascene opening, and then a plurality of second openings 43 are formed in the exposed first hard mask 38 with the second photoresist layer 44 as a mask. Next, the second photoresist layer 44 is removed. Note that the diameter of the first opening 41 is larger than the diameter of the second opening 43.

Figure 2F:
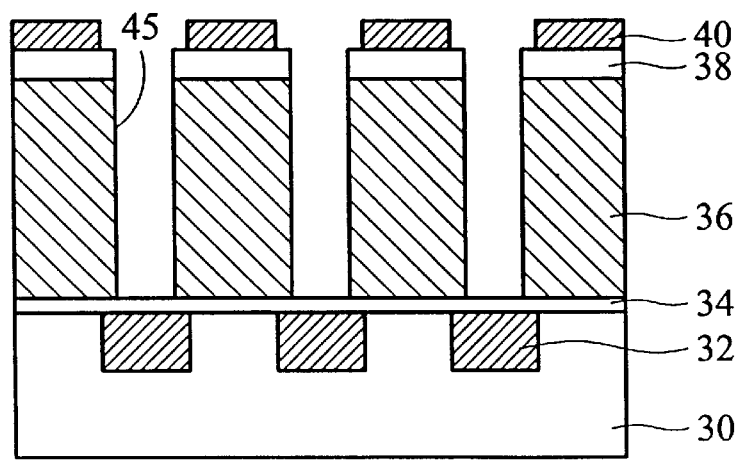

As shown in FIG. 2F, using a dry etching process with the first hard mask 38, a plurality of via holes 45 over the metal wire structures 32 are respectively formed in the low-k dielectric layer 36 with the dielectric separation layer 34 as an etch stop layer. Since the second photoresist layer 44 is removed prior to the formation of the via holes 45, the exposed sidewalls of the low-k dielectric layer 36 are not vulnerable to damage by oxygen plasma.

Figure 2G:
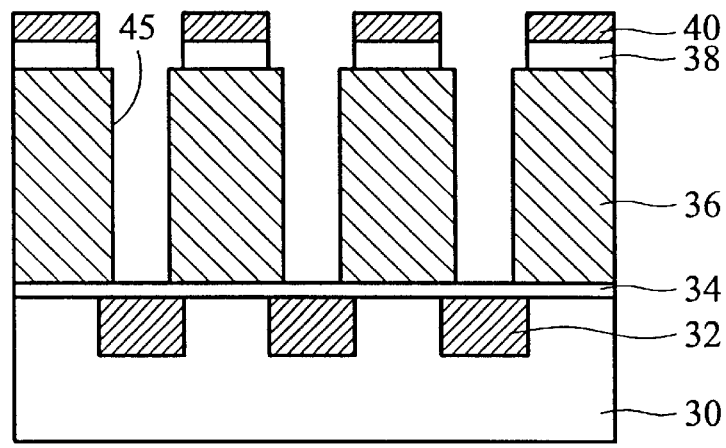
Figure 2H:
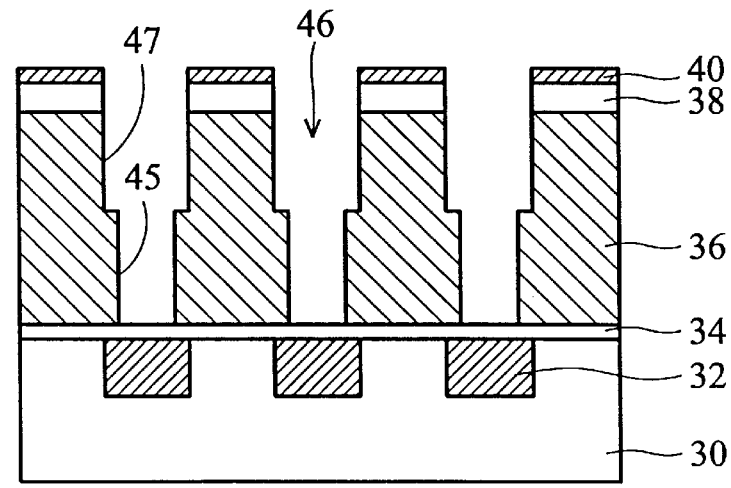
Figure 2I:
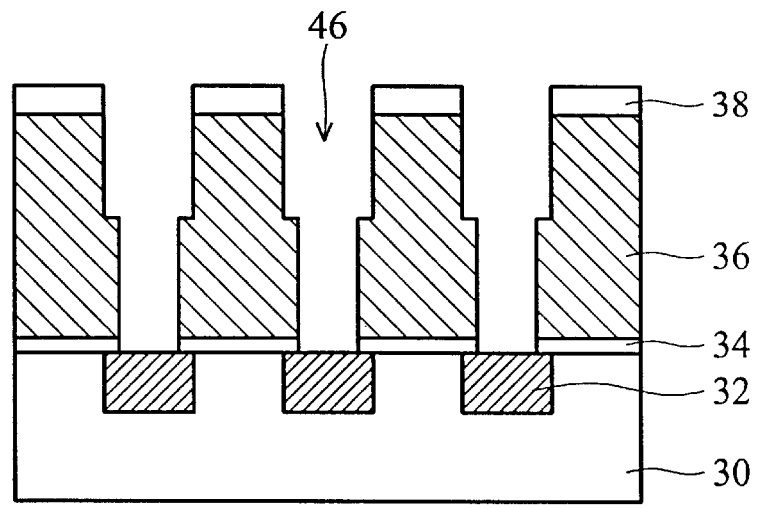

As shown in FIGS. 2G and 2H, the exposed regions of the first hard mask 38 are etched to level off the sidewalls of the dual hard masks 38 and 40, and then the exposed low-k dielectric layer 36 is etched to reach a predetermined depth. Thus, a plurality of trenches 47 passing through the via holes 45 are respectively formed in the low-k dielectric layer 36. The trench 47 and the underlying via hole 45 serve as a dual damascene opening 46. As shown in FIG. 2I, the exposed dielectric separation layer 34 and the second hard mask 40 are removed. As a result, the metal wire structure 32 is exposed at the bottom of the dual damascene opening 46.

Hereinafter, a method of forming a dual damascene structure in the dual damascene opening 46 is provided. Naturally, the nature of the dual damascene structure's fabrication is a design choice dependent on the fabrication process being employed.

Figure 2J:
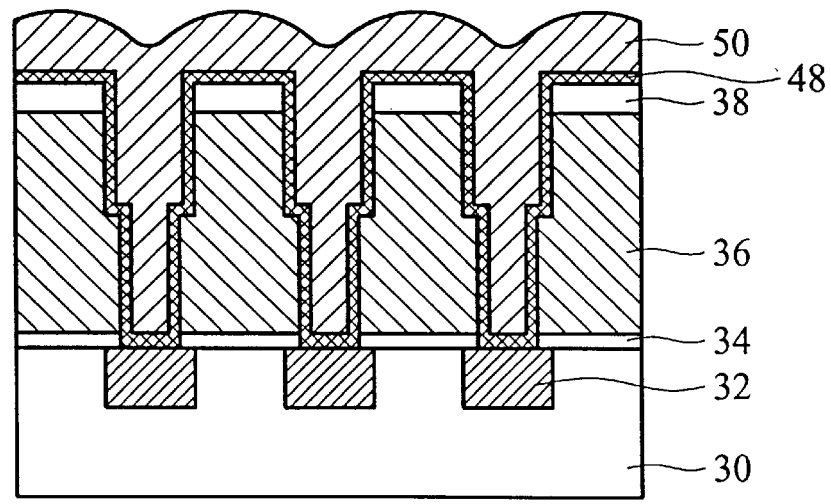

As shown in FIG. 2J, a barrier layer 48 is conformally deposited along the exposed surface of the semiconductor substrate 30. Preferably, the barrier layer 48 is Ta/TaN, Ti/TiN or W/WN. One purpose of the barrier layer 48 is to encapsulate copper interconnect from the surrounding low-k dielectric layer 36, and the other purpose is to provide the adhesion between copper interconnect and the surrounding low-k dielectric layer 36. Then, a conductive layer 50, preferably of copper, may be deposited by PVD, CVD, plating technique, or a combination of these techniques to fill the dual damascene openings 46. The method of the conductive layer 50 deposit is a design choice dependent on the fabrication process being employed.

Figure 2K:
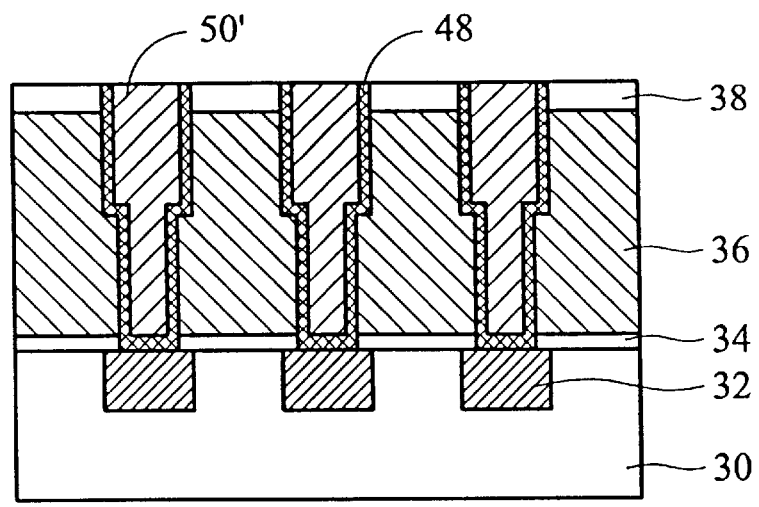

As shown in FIG. 2K, the conductive layer 50 and the barrier layer 48 residing above the trench 47 level are removed by either an etching or polishing technique. In the preferred embodiment, chemical-mechanical polishing (CMP) is used to polish away the excess conductive layer 50 and the barrier layer 48 so as to level off the top surface of the conductive layer 50 and the first hard mask 38. Consequently, the remaining part of the conductive layer 50 serves as the dual damascene structure 50'.

Figure 2L:
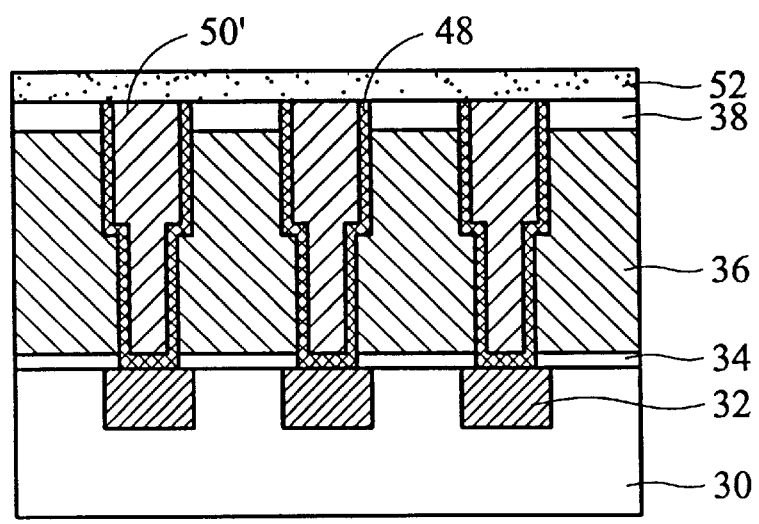

Finally, as shown in FIG. 2L, a sealing layer 52 is deposited over the exposed surface of the semiconductor substrate 30 so as to cover the top of the dual damascene structure 50'. The sealing layer 52, preferably of SiN or SiC, prevents the dual damascene structure 50' from oxidizing and prevents the atoms/ions in the dual damascene structure 50' from diffusing into the subsequently formed dielectric layer over the dual damascene structure 50'. In addition, by repeating the processes, additional interconnect structures can be fabricated to form metallization levels above the dual damascene structure 50'.

The dual damascene process of this invention has the following advantages: First, the dual hard masks 38 and 40, preferably of metallic materials, are able to prevent oxygen plasma from contact with the low-k dielectric layer 36 when the photoresist layers 42 and 44 are removed. Hence, the gap-filling capacity of subsequently deposited conductive layer 50 in the dual damascene opening 46 can be increased. Second, since the damage to the low-k dielectric layer 36 from the oxygen plasma is avoided, the use of low-k organic materials may be applied to the formation of the low-k dielectric layer 36. This can reduce RC delay and cross talk, and therefore chip size can be scaled down to the next generation. Third, the dual hard masks 38 and 40 can function as an anti-reflection coating (ARC) in subsequent deep ultra violet (DUV) photolithographic operations. Since a separate ARC is not necessary, production costs are lowered and the dual damascene process is simplified. Fourth, there is no need to form an etch stop layer inside the low-k dielectric layer 36 in the first embodiment, thus the formation of the low-k dielectric layer 36 is a one-stage operation, such as performing spin-on coating process or CVD process. This further lowers costs and simplifies the dual damascene process.

Second Embodiment

A dual damascene process using one hard mask is provided. Preferably, the hard mask is of metallic material.

Figure 3A:
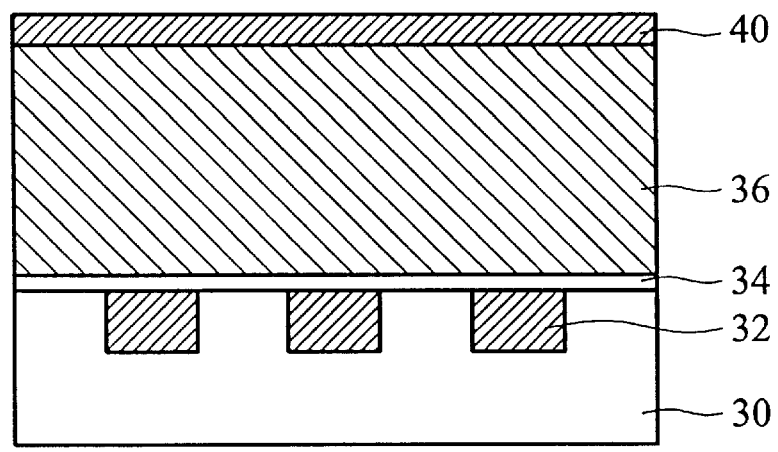
FIGS. 3A to 3I are cross-sectional diagrams showing a dual damascene process in the second embodiment of the present invention.

FIGS. 3A to 3I are cross-sectional diagrams showing a dual damascene process in the first embodiment of the present invention. As shown in FIG. 3A, the semiconductor substrate 30 has metal wire structures 32, the dielectric separation layer 34, the low-k dielectric layer 36 formed on the dielectric separation layer 34, and the hard mask 40 formed on the low-k dielectric layer 36. Preferably, the hard mask 40 is of metallic material, such as Ti, TiN, Ta, TaN, Al, or AlCu.

Figure 3B:
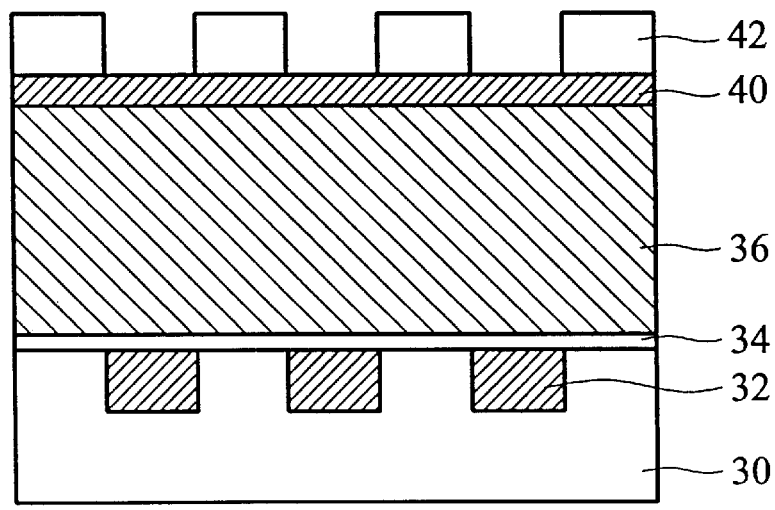
Figure 3C:
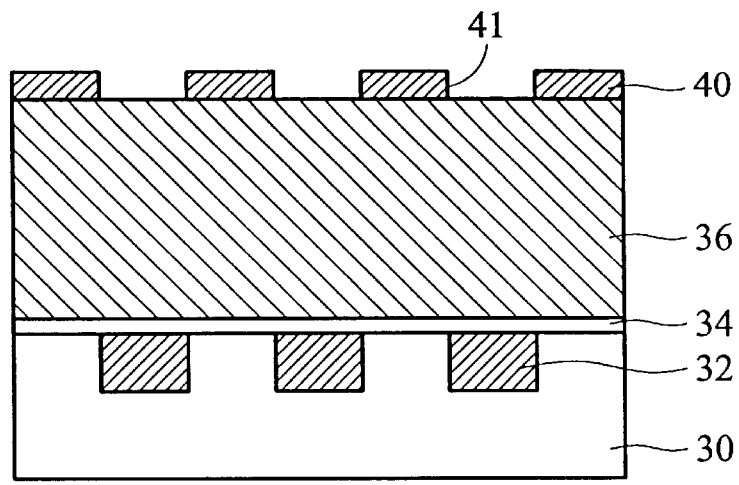
Figure 3D:
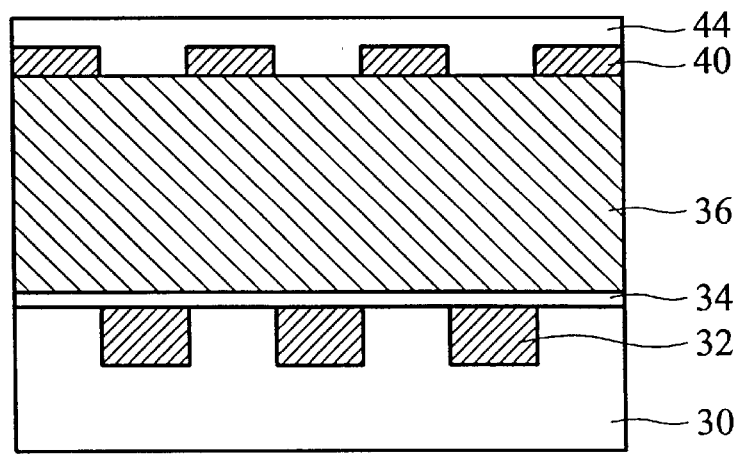
Figure 3E:
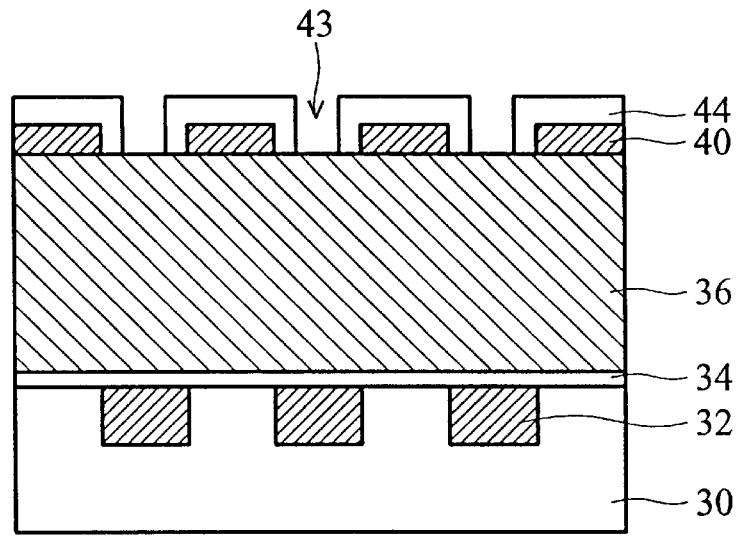

As shown in FIGS. 3B and 3C, the first photoresist layer 42 is patterned on the hard mask 40 to define a trench of a dual damascene opening, and then the first openings 41 are formed in the hard mask 40 with the first photoresist layer 42 as a mask. Next, the first photoresist layer 42 is removed. As shown in FIGS. 3D and 3E, the second photoresist layer 44 is patterned on the hard mask 40 and the low-k dielectric layer 36 to define a via hole of a dual damascene opening, and then the second openings 43 are formed in the second photoresist layer 44.

Figure 3F:
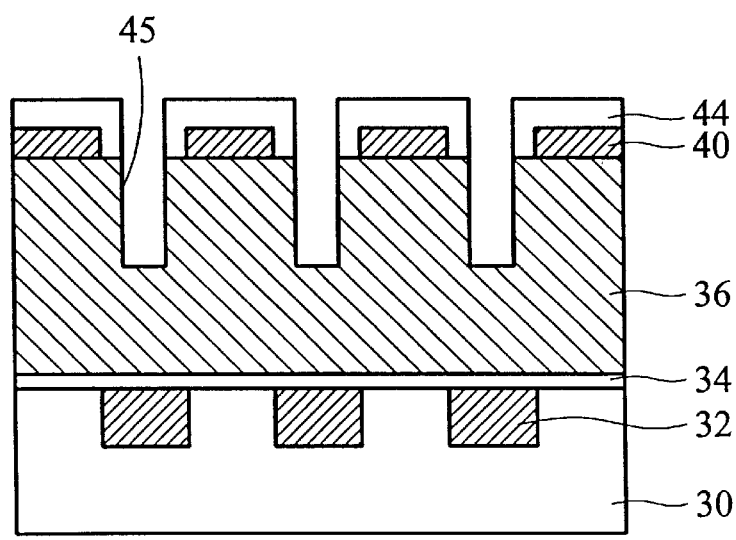
Figure 3G:
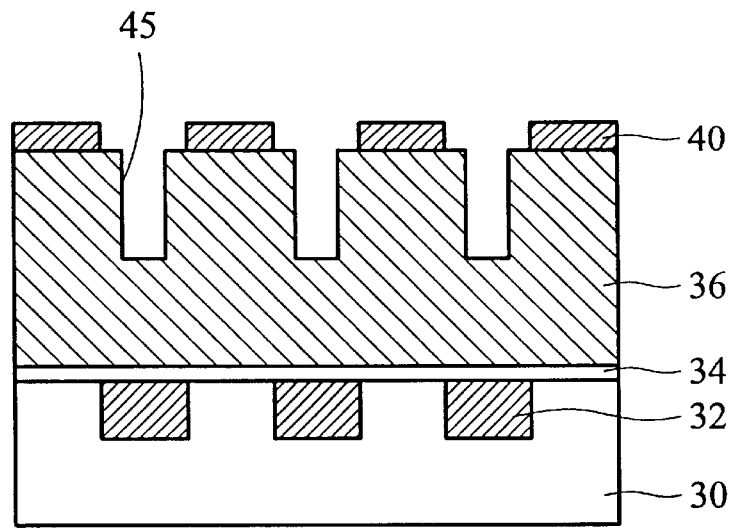

As shown in FIG. 3F, using a dry etching process with the second photoresist layer 44, the via holes 45 over the metal wire structures 32 are respectively formed in the low-k dielectric layer 36. Preferably, the depth of the via hole 45 is larger than half of the height of the low-k dielectric layer 36. Next, as shown in FIG. 3G, the second photoresist layer 44 is removed. Note that since the diameter of the first opening 41 is larger than the diameter of the second opening 43, a part of the low-k dielectric layer 36 surrounding the via hole 45 is exposed.

Figure 3H:
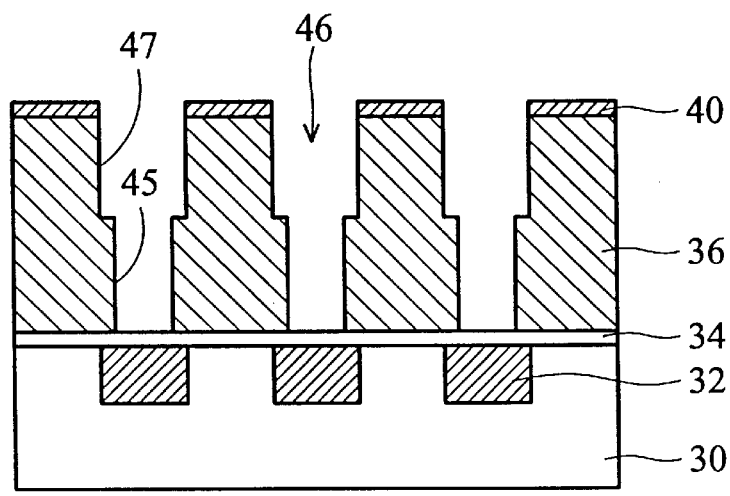
Figure 3I:
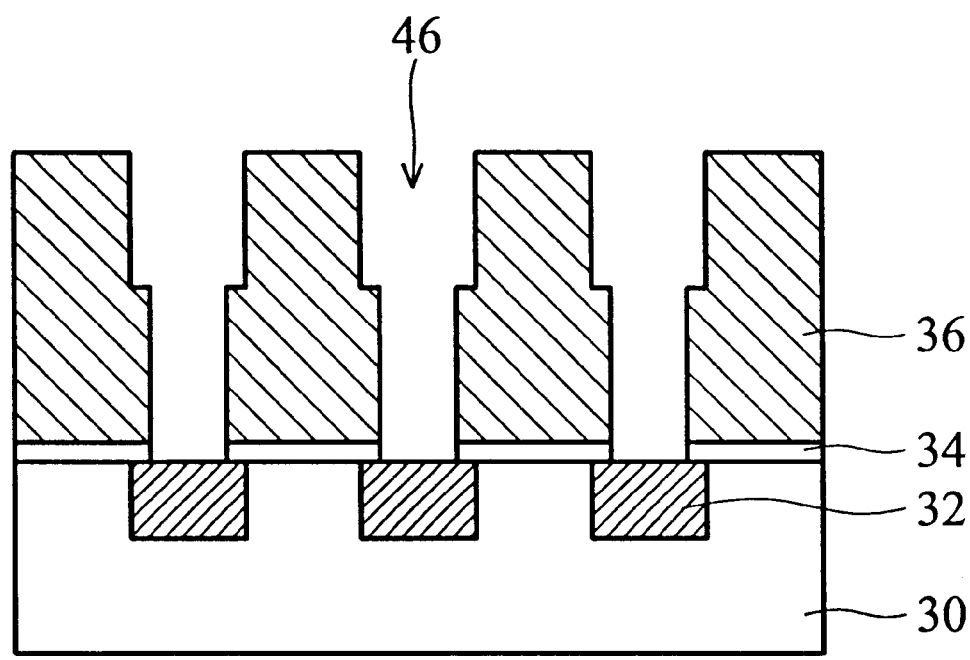

As shown in FIG. 3H, using dry etching with the hard mask 40, the low-k dielectric layer 36 underlying the via holes 45 is etched to expose the dielectric separation layer 34 over the metal wire structures 32. Meanwhile, the low-k dielectric layer 36 surrounding the via hole 45 is etched to reach a predetermined depth. Thus, the trenches 47 passing through the via holes 45 are respectively formed in the low-k dielectric layer 36. The trench 47 and the underlying via hole 45 serve as a dual damascene opening 46. As shown in FIG. 3I, the exposed dielectric separation layer 34 and the hard mask 40 are removed. As a result, the metal wire structure 32 is exposed at the bottom of the dual damascene opening 46.

Hereinafter, a method of forming a dual damascene structure in the dual damascene opening 46 is provided. Naturally, the nature of the dual damascene structure's fabrication is a design choice dependent on the fabrication process being employed. The above-mentioned method shown in FIGS. 2J to 2L can be provided to form a dual damascene structure in the dual damascene opening 46.

Third Embodiment

A dual damascene process using dual hard masks is provided wherein an etch stop layer is additionally provided in the low-dielectric layer. Preferably, the dual hard masks are both of metallic materials. Alternatively, one of the dual hard masks is of metallic materials.

Figure 4A:
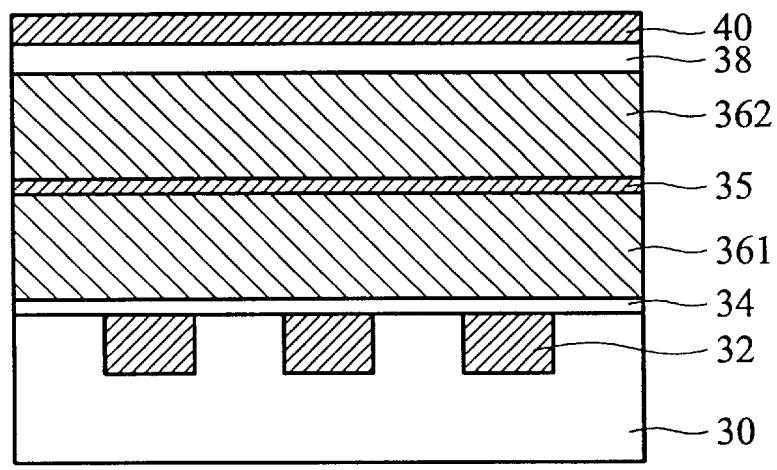
FIGS. 4A to 4J are cross-sectional diagrams showing a dual damascene process in the third embodiment of the present invention.
Figure 4B:
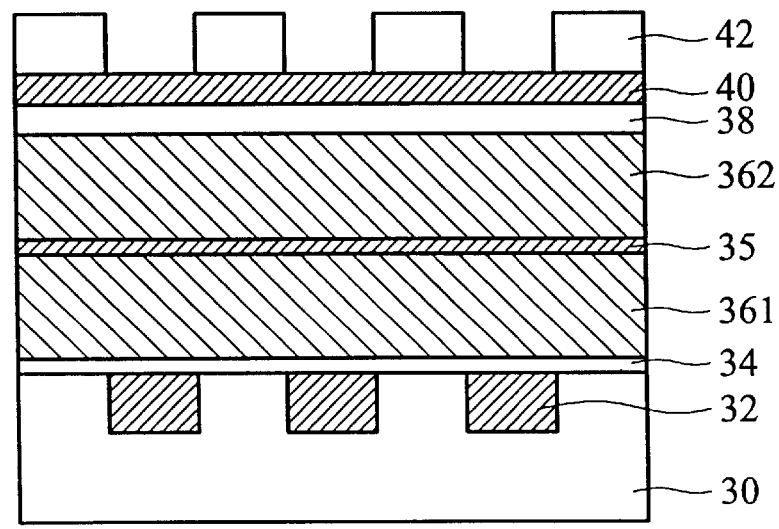
Figure 4C:
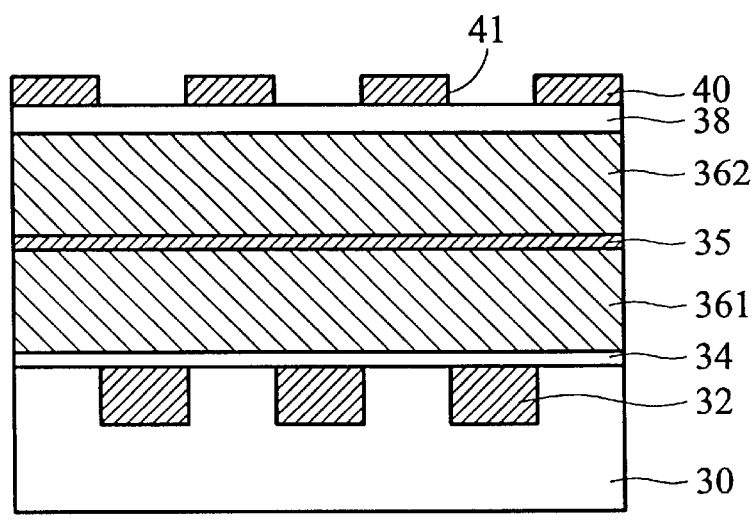
Figure 4D:
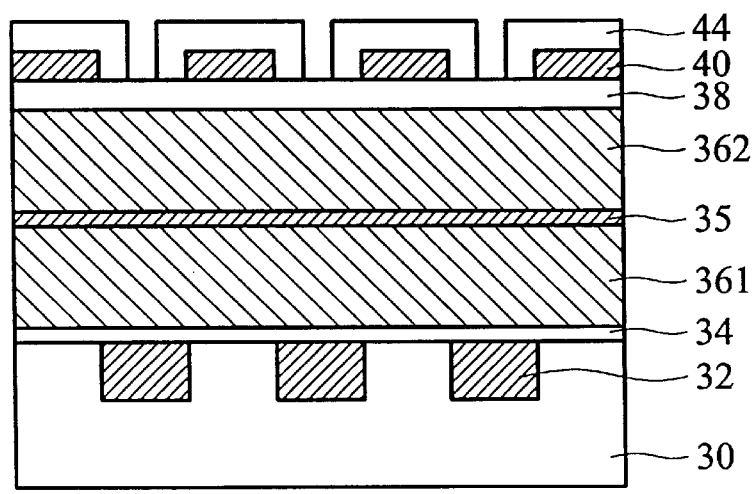
Figure 4E:
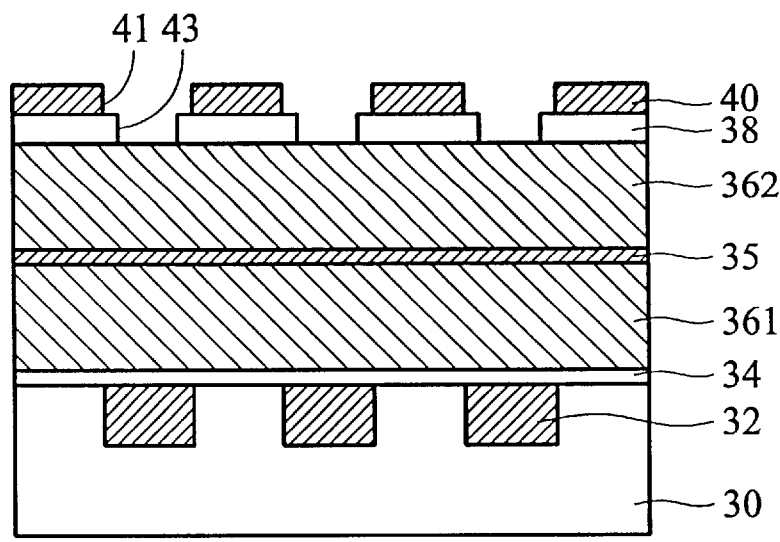

FIGS. 4A to 4J are cross-sectional diagrams showing a dual damascene process in the second embodiment of the present invention. As shown in FIG. 4A, the semiconductor substrate 30 comprises the metal wire structures 32, the dielectric separation layer 34 covering the metal wire structures 32 and the exposed substrate 30, a first low-k dielectric layer 361 formed on the dielectric separation layer 34, an etching stop layer 35 formed on the first low-k dielectric layer 361, and a second low-k dielectric layer 362 formed on the etch stop layer 35. The materials of the first low-k dielectric layer 361 and the second low-k dielectric layer 362 may be selected from organic materials, such as spin-on polymer (SOP), FLARE, SILK, PARYLENE and/or PAE-II, and formed through a spin-coating process. Alternatively, the materials of the first low-k dielectric layer 361 and the second low-k dielectric layer 362 may be selected from $SiO_2$ based materials, such as $SiO_2$, FSG or USG through a spin-coating process, or BLACK DIAMOND, CORAL, AURORA, and FLOWFILL, and formed through CVD Process.

The etching stop layer 35, may be of $SiO_2$, SiC, SiN, SRO or SiON, and serves as an etching endpoint of the trench 47 and as a hard mask of the via hole 45. In addition, the first hard mask 38 and the second hard mask 40 are sequentially formed on the second low-k dielectric layer 362. Preferably, the first hard mask 38 may be of metallic materials selected from Ti, TiN, Ta, TaN, Al, or AlCu. The second hard mask 40 may be of metallic materials selected from Ti, TiN, Ta, TaN, Al, or AlCu, and alternatively may be of dielectric materials selected from $SiO_2$, SiC, SiN, SRO or SiON.

As shown in FIGS. 4B to 4E, the processes used in the fabrication of the first photoresist layer 42, the first openings 41, the second photoresist layer 44, and the second openings 43 are substantially the same as the processes used in the first embodiment.

Figure 4F:
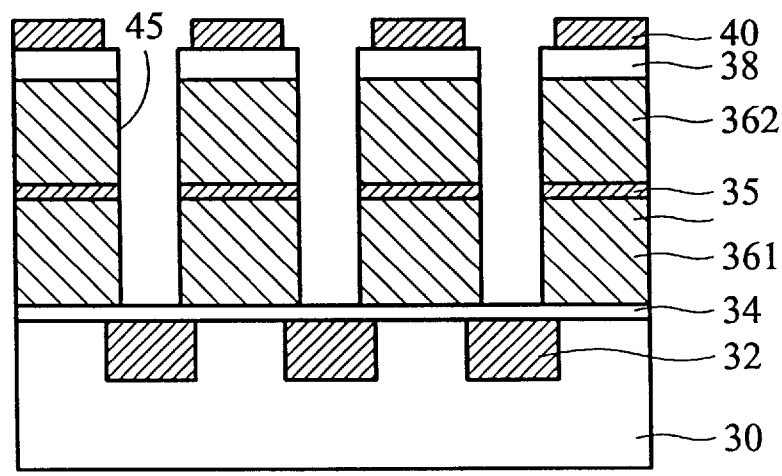

As shown in FIG. 4F, using a dry etching process with the first hard mask 38, the second low-k dielectric layer 362, the etch stop layer 35 and the first low-k dielectric layer 361 under the second openings 43 are removed with the dielectric separation layer 34 as an etch stop layer. Thus, the via holes 45 are formed over the metal wire structures 32 respectively.

Figure 4G:
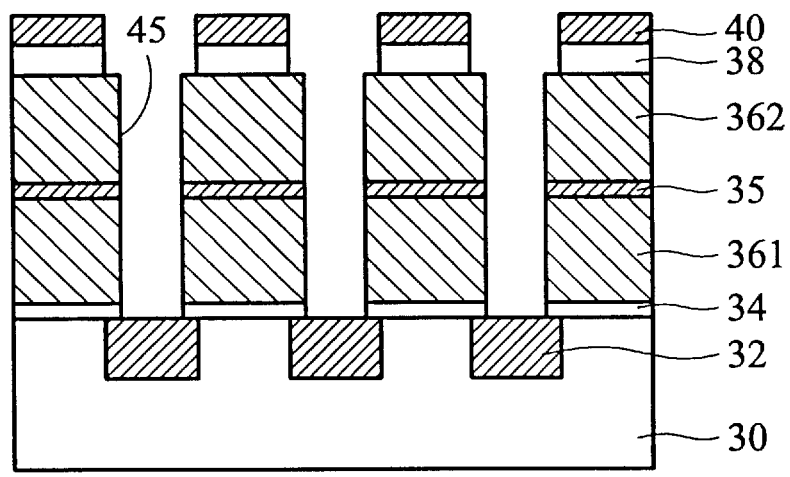
Figure 4H:
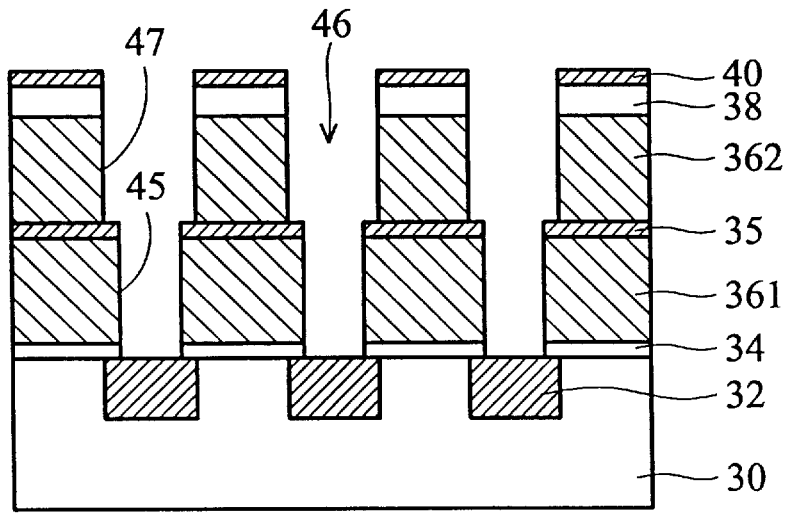
Figure 4I:
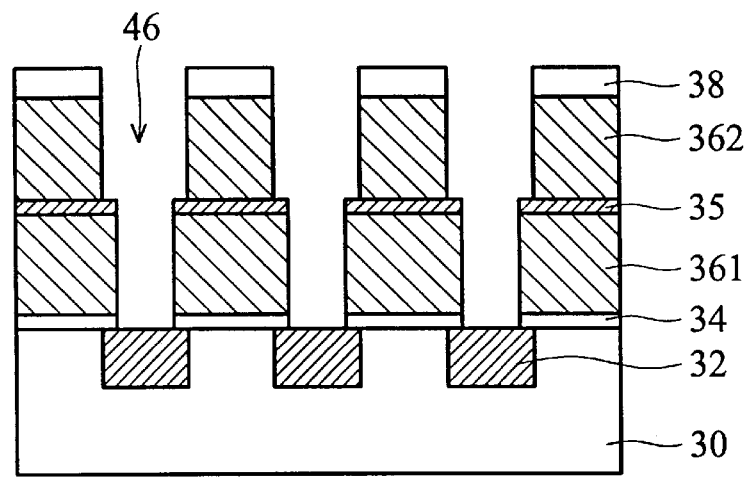

As shown in FIGS. 4G and 4H, the exposed regions of the first hard mask 38 are etched to level off the sidewalls of the dual hard masks 38 and 40, and then the exposed second low-k dielectric layer 362 is etched until the etch stop layer 35 is exposed. Thus, the trenches 47 corresponding to the via holes 45 are formed in the second low-k dielectric layer 362. The trench 47 and the underlying via hole 45 serve as the dual damascene opening 46. As shown in FIG. 4I, the exposed dielectric separation layer 34 and the second hard mask 40 are removed. As a result, the metal wire 12 is exposed at the bottom of the dual damascene opening 46.

Figure 4J:
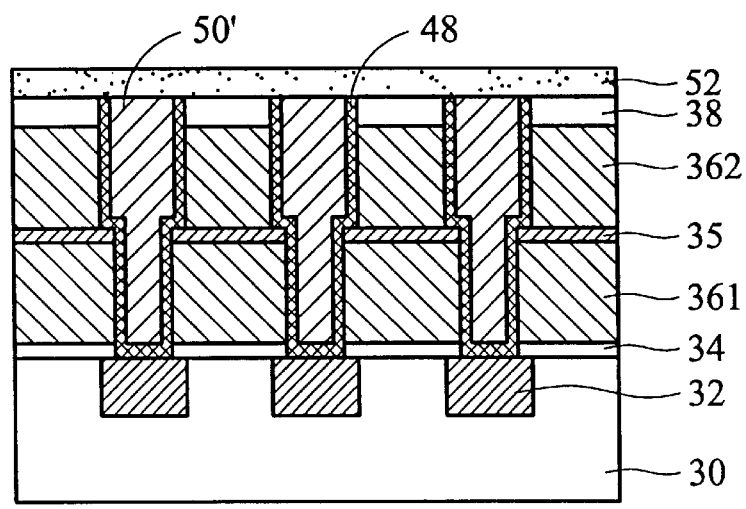

Hereinafter, a dual damascene structure is provided in the dual damascene opening 46. Naturally, the nature of the dual damascene structure's fabrication is a design choice dependent on the fabrication process being employed. Preferably, as shown in FIG. 4J, the processes used in the fabrication of the barrier layer 48, the conductive layer 50, the damascene structure 50', and the sealing layer 52 are substantially the same as the processes used in the first embodiment.

It is to be understood that the present invention is not limited to the embodiments described above, but encompasses any and all embodiments within the scope of the following claims.

What is claimed is:

1. A dual damascene process, comprising the steps of:
   providing a semiconductor substrate which has a conductive structure, a dielectric separation layer covering the conductive structure and a low-k dielectric layer over the dielectric separation layer;

forming a first hard mask of metallic materials on the low-k dielectric layer, wherein the first hard mask is selected from Ti, TiN, Ta, TaN, Al, or AlCu;

forming a second hard mask on the first hard mask, wherein the second hard mask is selected from Ti, TiN, Ta, TaN, Al or AlCu, alternatively the second hard mask layer is selected from $SiO_2$, SiC, SiN, SRO or SiON;

forming a first opening in the second hard mask over the conductive structure;

forming a second opening in the first hard mask under the first opening, wherein the diameter of the first opening is larger then the second opening;

removing the low-k dielectric layer not covered by the first hard mask until the dielectric separation layer is exposed so as to form a via hole;

removing the first hard mask not covered by the second hard mask; and removing the low-k dielectric layer not covered by the first hard mask to reach a predetermined depth so as to form a trench over the via hole, wherein the trench and the via hole serve as a dual damascene opening.

2. The dual damascene process according to claim 1, wherein the low-k dielectric layer is of organic polymer formed by a spin-on coating process.

3. The dual damascene process according to claim 1, wherein the low-k dielectric layer is of $SiO_2$ based materials formed by a chemical vapor deposition (CVD) process.

4. The dual damascene process according to claim 1, further comprising a step of removing the exposed dielectric separation layer at the bottom of the dual damascene opening to expose the conductive structure.

5. The dual damascene process according to claim 4, further comprising a step of forming a conductive layer to fill the dual damascene opening.

6. The dual damascene process according to claim 5, further comprising a step of forming a barrier layer on the sidewall and bottom of the dual damascene opening prior to the formation of the conductive layer.

7. A dual damascene process, comprising the steps of:

providing a semiconductor substrate which has a conductive structure and a dielectric separation layer covering the conductive structure;

forming a first low-k dielectric layer on the dielectric separation layer;

forming an etch stop layer on the first low-k dielectric layer;

forming a second low-k dielectric layer on the etch stop layer;

forming a first hard mask of metallic materials on the second low-k dielectric layer. wherein the first hard mask is selected from Ti, TiN, Ta, TaN, Al, or AlCu;

forming a second hard mask on the first hard mask, wherein the second hard mask is selected from Ti, TiN, Ta, TaN, Al or AlCu, alternatively the second hard mask layer is selected from $SiO_2$, SiC, SiN, SRO or SiON;

forming a first opening in the second hard mask over the conductive structure;

forming a second opening in the first hard mask under the first opening, wherein the diameter of the first opening is larger then the second opening;

removing the second low-k dielectric layer not covered by the first hard mask and removing the first low-k dielectric layer not covered by the etch stop layer until the dielectric separation layer is exposed so as to form a via hole;

removing the first hard mask not covered by the second hard mask; and removing the second low-k dielectric layer not covered by the first hard mask to reach a predetermined depth so as to form a trench over the via hole, wherein the trench and the via hole serves as a dual damascene opening.

8. The dual damascene process according to claim 7, wherein the first low-k dielectric layer is of organic polymer formed by a spin-on coating process.

9. The dual damascene process according to claim 7, wherein the first low-k dielectric layer is of $SiO_2$ based materials formed by a chemical vapor deposition (CVD) process.

10. The dual damascene process according to claim 7, wherein the second low-k dielectric layer is of organic polymer formed by a spin-on coating process.

11. The dual damascene process according to claim 7, wherein the second low-k dielectric layer is of $SiO_2$ based materials formed by a chemical vapor deposition (CVD) process.

12. The dual damascene process according to claim 7, further comprising a step of removing the exposed dielectric separation layer at the bottom of the dual damascene opening to expose the conductive structure.

13. The dual damascene process according to claim 7, further comprising a step of forming a conductive layer to fill the dual damascene opening.

14. The dual damascene process according to claim 13, further comprising a step of forming a barrier layer on the sidewall and bottom of the dual damascene opening prior to the formation of the conductive layer.

* * * * *